US012610717B2

(12) United States Patent
Meng et al.

(10) Patent No.: US 12,610,717 B2
(45) Date of Patent: *Apr. 21, 2026

(54) DISPLAY SUBSTRATE AND PREPARATION METHOD THEREFOR, AND DISPLAY PANEL

(71) Applicant: BOE Technology Group Co., Ltd., Beijing (CN)

(72) Inventors: Qiuhua Meng, Beijing (CN); Xueyan Tian, Beijing (CN); Yueping Zuo, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 393 days.

This patent is subject to a terminal disclaimer.

(21) Appl. No.: 18/198,951

(22) Filed: May 18, 2023

(65) Prior Publication Data

US 2023/0292577 A1    Sep. 14, 2023

Related U.S. Application Data

(63) Continuation of application No. 17/913,778, filed as application No. PCT/CN2021/074947 on Feb. 2, 2021, now Pat. No. 12,464,932.

(30) Foreign Application Priority Data

Mar. 25, 2020    (CN) .......................... 202010217464.3

(51) Int. Cl.
*H10K 59/80*        (2023.01)
*H10K 59/12*        (2023.01)
(Continued)

(52) U.S. Cl.
CPC ....... *H10K 59/873* (2023.02); *H10K 59/1201* (2023.02); *H10K 59/131* (2023.02); (Continued)

(58) Field of Classification Search
CPC ............. H10K 59/873; H10K 59/1201; H10K 59/131; H10K 71/20; H10K 2102/311; (Continued)

(56) References Cited

U.S. PATENT DOCUMENTS 12,464,932 B2 * 11/2025 Meng ................... H10D 86/451
2016/0118420 A1 * 4/2016 Yang ...................... H10D 86/60
257/40

(Continued)

FOREIGN PATENT DOCUMENTS

CN        104795403 A      7/2015
CN        105552083 A      5/2016
(Continued)

OTHER PUBLICATIONS

CN202010217464.3 first office action.
PCT/CN2021/074947 international search report.

*Primary Examiner* — J. E. Schoenholtz
(74) *Attorney, Agent, or Firm* — IPro, PLLC

(57) ABSTRACT

The present application relates to the technical field of display. Disclosed are a display substrate and a preparation method therefor, and a display panel, which aim at improving the bending resistance of a flexible display panel, and increasing the yield of a flexible display product. The display substrate comprises: a base substrate provided with a display area and a non-display area surrounding the display area; a gate layer located on the base substrate; an interlayer insulation layer, which is located on the side of the gate layer that faces away from the base substrate and comprises a first organic insulation layer and a first inorganic insulation layer, wherein the first organic insulation layer covers the display area and part of the non-display area; a source and drain layer located on the side of the interlayer insulation layer that faces away from the base substrate.

19 Claims, 8 Drawing Sheets

X1-X2

(51) Int. Cl.
|  |  |
|---|---|
| *H10K 59/131* | (2023.01) |
| *H10K 71/20* | (2023.01) |
| *H10K 102/00* | (2023.01) |

(52) U.S. Cl.
CPC ....... *H10K 71/20* (2023.02); *H10K 2102/311* (2023.02); *H10K 2102/351* (2023.02)

(58) Field of Classification Search
CPC ......... H10K 2102/351; H10K 59/1213; H10K 50/84; H10K 59/12; H10D 86/443; H10D 86/451; H10D 86/60; H10D 86/411; H10D 86/021; H10D 86/431; Y02E 10/549
See application file for complete search history.

(56) References Cited

U.S. PATENT DOCUMENTS

| | | | |
|---|---|---|---|
| 2017/0033312 A1 | 2/2017 | Kim et al. | |
| 2017/0069701 A1 | 3/2017 | Cai | |
| 2019/0229289 A1 | 7/2019 | Kim et al. | |
| 2020/0403171 A1* | 12/2020 | Park | H10K 59/131 |
| 2021/0066650 A1 | 3/2021 | Yu et al. | |
| 2024/0215393 A1* | 6/2024 | Meng | H10K 59/1201 |

FOREIGN PATENT DOCUMENTS

| | | |
|---|---|---|
| CN | 207833884 U | 9/2018 |
| CN | 110400891 A | 11/2019 |
| CN | 111384069 A | 7/2020 |

* cited by examiner

DISPLAY SUBSTRATE AND PREPARATION METHOD THEREFOR, AND DISPLAY PANEL

CROSS-REFERENCE TO RELATED APPLICATIONS

This application is a continuation of U.S. patent application Ser. No. 17/913,778, filed on Sep. 22, 2022, which is a National Stage of International Application No. PCT/CN2021/074947, filed on Feb. 2, 2021. The International Application claims priority to Chinese Patent Application No. 202010217464.3, filed to China National Intellectual Property Administration on Mar. 25, 2020. The afore-mentioned patent applications are hereby incorporated by reference in their entireties.

FIELD

The present application relates to the field of display technology, in particular to a display substrate and a preparation method therefor, and a display panel.

BACKGROUND

With rapid development and popularization of an electronic product, such as a smartphone, a wearable device, an on-board display and augmented Reality/virtual Reality (AR/VR), carrying a flexible display, the market of medium-and-small sized products tends to be in hot demand, especially, a novel high-performance display technology represented by an active-matrix organic light-emitting diode (AMOLED) technology is making it into the market of high-end smartphones at a quick pace with its unique performance advantages in aspects of display performance, lightness and thinness, bendability, foldability and the like.

In a process of fabricating a backboard of a conventional AMOLED, temporary local bending is realized mainly through Poly thin film transistors (TFTs) and a polyimide (PI) base, but bending is allowed only within a certain range. Therefore, how to improve bending resistance of the backboard seems to be one of key research directions of AMOLED all the time.

SUMMARY

The present application discloses a display substrate and a preparation method therefor, and a display panel, which aim at improving the bending resistance of a flexible display panel, and increasing the yield of a flexible display product.

A display substrate includes: a base substrate, provided with a display area and a non-display area surrounding the display area; a gate layer on the base substrate; an interlayer insulation layer on a side of the gate layer away from the base substrate, including a first organic insulation layer and a first inorganic insulation layer, wherein the first organic insulation layer covers the display area and part of the non-display area; a source and drain layer on a side of the interlayer insulation layer away from the base substrate; and an encapsulation layer, covering the display area and part of the non-display area, wherein an orthographic projection of a boundary of the encapsulation layer on the base substrate surrounds an orthographic projection of the first organic insulation layer on the base substrate.

Optionally, the non-display area includes a fan routing wire area and a bonding area in a first side of the display area, and a gate driving circuit area on at least one side of two opposite sides of the display area, wherein the two opposite sides are adjacent to the first side; and the first organic insulation layer covers the gate driving circuit area, and the orthographic projection of the first organic insulation layer on the base substrate does not overlap with the bonding area.

Optionally, the first inorganic insulation layer at least covers part of the non-display area, and an orthographic projection of the first inorganic insulation layer on the non-display area overlaps with an orthographic projection of the first organic insulation layer on the non-display area.

Optionally, the first inorganic insulation layer covers the fan routing wire area and the bonding area.

Optionally, an orthographic projection of the first inorganic insulation layer on the base substrate is in the non-display area and surrounds the display area, the first inorganic insulation layer is on a side of the first organic insulation layer away from the gate layer, and the first inorganic insulation layer covers a boundary of the first organic insulation layer.

Optionally, the orthographic projection of the first inorganic insulation layer on the base substrate does not overlap with the gate driving circuit area.

Optionally, the first inorganic insulation layer is between the gate layer and the first organic insulation layer, and the first inorganic insulation layer covers the display area and the non-display area.

Optionally, a part of the first inorganic insulation layer covering the display area is provided with a hollow-out part, and the hollow-out part does not overlap with a pattern of the gate layer.

Optionally, the display substrate further includes at least one layer of blocking dam in the non-display area and sequentially arranged in a direction from the display area to the non-display area; and an orthographic projection of the boundary of the first organic insulation layer on the base substrate is on a side of a last layer of blocking dam facing the display area.

Optionally, a thickness of the first organic insulation layer is in a range of 1 μm to 2 μm, and a thickness of the first inorganic insulation layer is in a range of 50 nm to 150 nm.

A display panel includes the display substrate according to any one of the above.

A preparation method for a display substrate includes: preparing a gate layer on a base substrate, wherein the base substrate is provided with a display area and a non-display area surrounding the display area; preparing an interlayer insulation layer on the gate layer, wherein the interlayer insulation layer includes a first organic insulation layer and a first inorganic insulation layer, and the first organic insulation layer covers the display area and part of the non-display area; preparing a source and drain layer on the interlayer insulation layer; and preparing an encapsulation layer on the source and drain layer, wherein the encapsulation layer covers the display area and part of the non-display area, and an orthographic projection of a boundary of the encapsulation layer on the base substrate surrounds an orthographic projection of the first organic insulation layer on the base substrate.

Optionally, the preparing the interlayer insulation layer on the gate layer specifically includes: depositing the first organic insulation layer on the gate layer, and forming a pattern of the first organic insulation layer through a patterning process; and depositing the first inorganic insulation layer on the first organic insulation layer, and forming a pattern of the first inorganic insulation layer through the patterning process, wherein an orthographic projection of the pattern of the first inorganic insulation layer on the base substrate is in the non-display area and surrounds the display area, and the pattern of the first inorganic insulation layer covers a boundary of the first organic insulation layer.

Optionally, the preparing the interlayer insulation layer on the gate layer specifically includes: depositing the first inorganic insulation layer on the gate layer, and forming a pattern of the first inorganic insulation layer through a patterning process; and depositing the first organic insulation layer on the first inorganic insulation layer, and forming a pattern of the first organic insulation layer through the patterning process.

DETAILED DESCRIPTION OF THE EMBODIMENTS

In a process of fabricating a backboard of a related AMOLED, temporary local bending is realized merely through polysilicon thin film transistors (Poly TFTs) and a flexible substrate (e.g., PI substrate), but bending is allowed merely within a certain range, so bending performance is poor. The inventor discovers that in a process of fabricating the backboard, bending stability and reliability of metal layers such as a gate metal routing wire layer and a source and drain metal routing wire layer are one of main factors of restricting a flexible backboard, so by improving an interlayer insulation layer between the gate metal routing wire layer and the source and drain metal routing wire layer, bending reliability of the gate metal routing wire layer and the source and drain metal routing wire layer can be improved, and the bending performance of the backboard is improved. Specifically, the bending resistance of the backboard may be improved by selecting an organic interlayer insulation layer to replace an inorganic interlayer insulation layer. However, under the condition of replacing the inorganic layer with the organic interlayer insulation layer, situations of poor encapsulation, breakdown and burning of routing wires and the like are prone to occurring, which leads to failure of a display substrate.

In view of the above problem, embodiments of the present application disclose a display substrate and a preparation method therefor, and a display panel. Specifically, by improving a structure of an interlayer insulation layer of a thin film transistor in a flexible display panel, bending resistance of a flexible display substrate is improved, the situations of poor encapsulation, breakdown and burning of the routing wires and the like are avoided, and then the yield of a flexible display product is improved.

Technical solutions in embodiments of the present application will be described clearly and completely below with reference to the accompanying drawings in the embodiments of the present application. Apparently, the described embodiments are merely some but not all embodiments of the present application. Based on the embodiments in the present application, all other embodiments obtained by those ordinarily skilled in the art without creative work fall within the protection scope of the present application.

Figure 1:
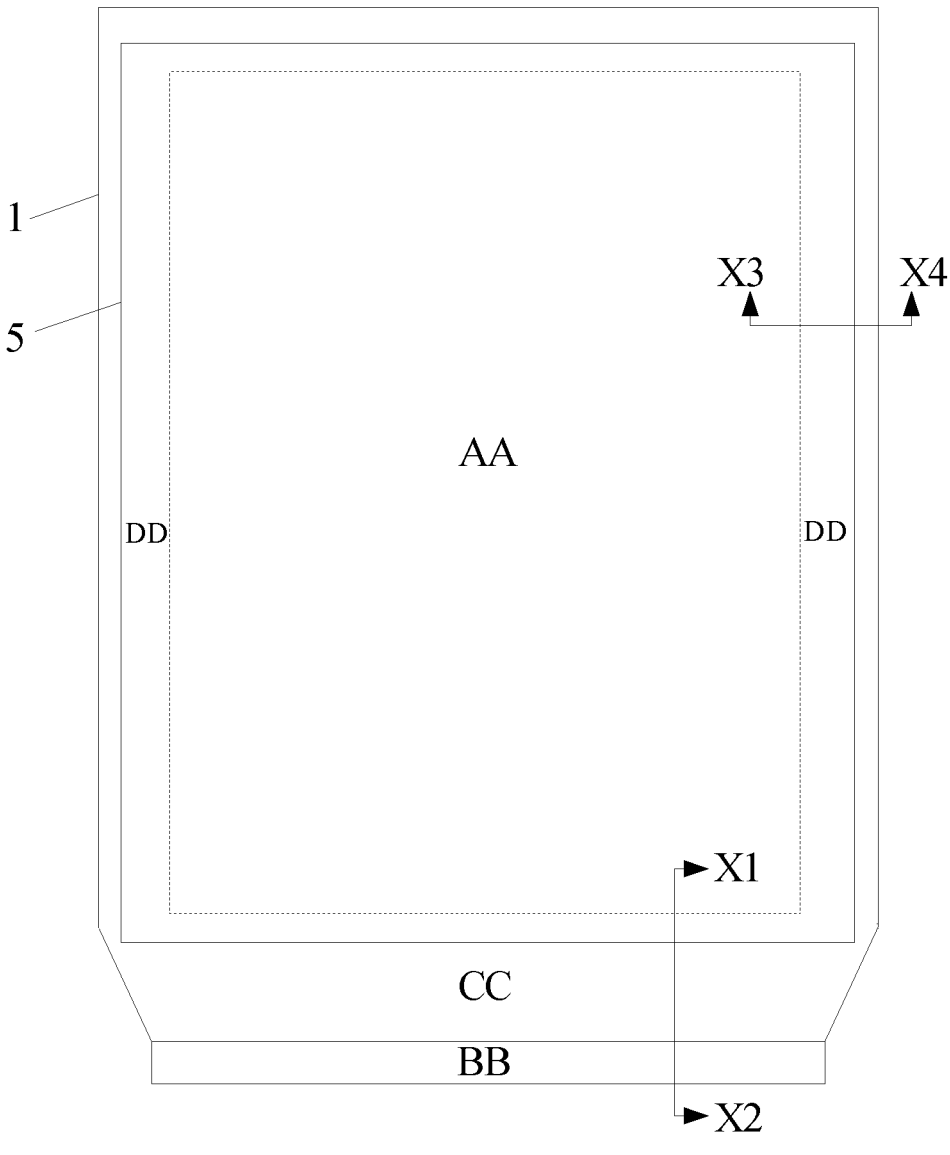
FIG. 1 is a schematic structural diagram of a front of a display substrate provided by an embodiment of the present application.
Figure 2:
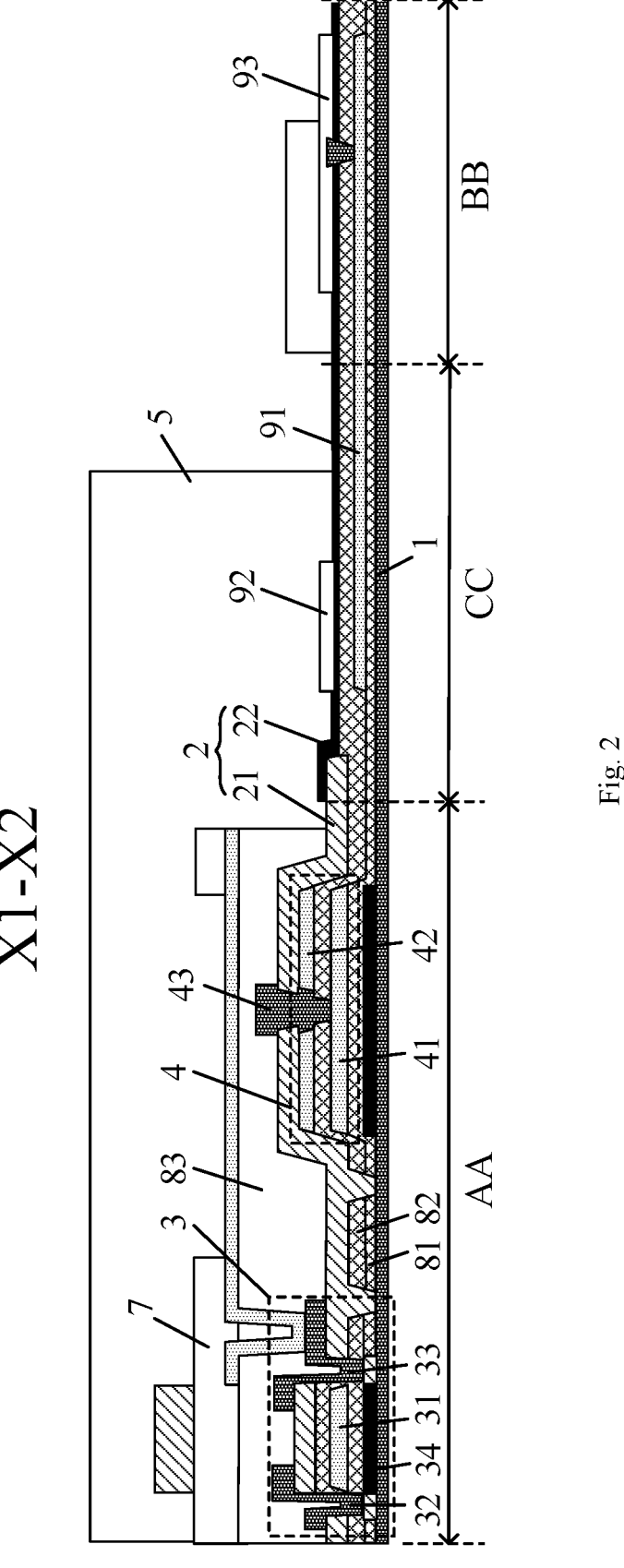
FIG. 2 is a schematic structural diagram of a partial cross-section of a display substrate in a direction of X1-X2 in FIG. 1 provided by an embodiment of the present application.
Figure 3:
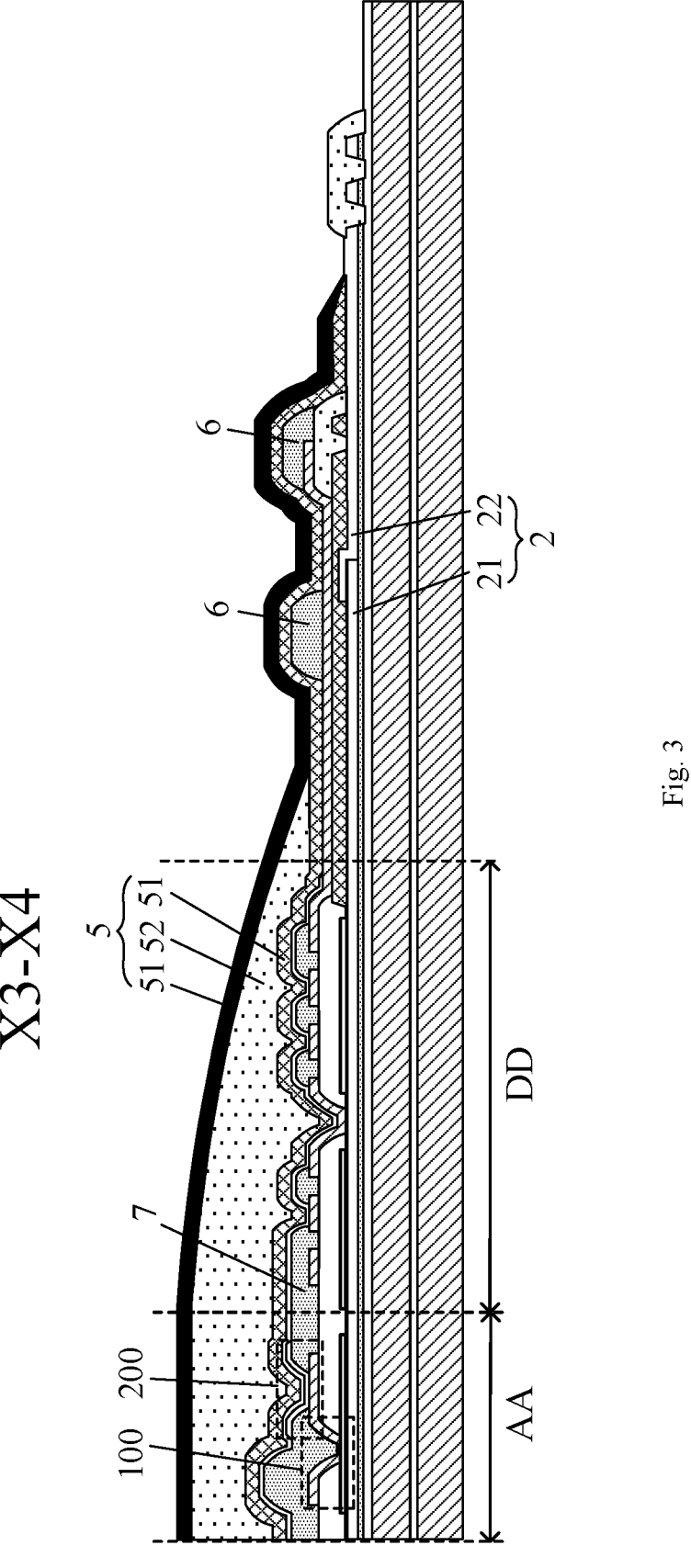
FIG. 3 is a schematic structural diagram of a partial cross-section of a display substrate in a direction of X3-X4 in FIG. 1 provided by an embodiment of the present application.
Figure 4:
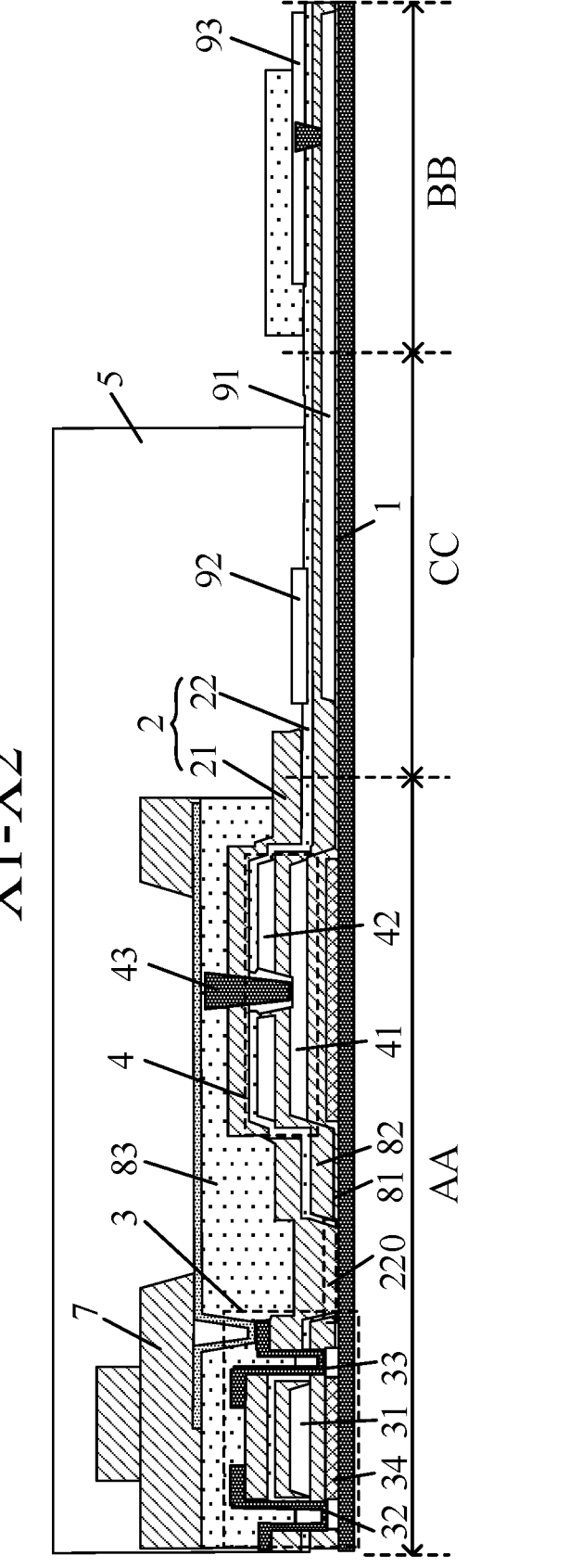
FIG. 4 is a schematic structural diagram of a partial cross-section of a display substrate in a direction of X1-X2 in FIG. 1 provided by another embodiment of the present application.
Figure 5:
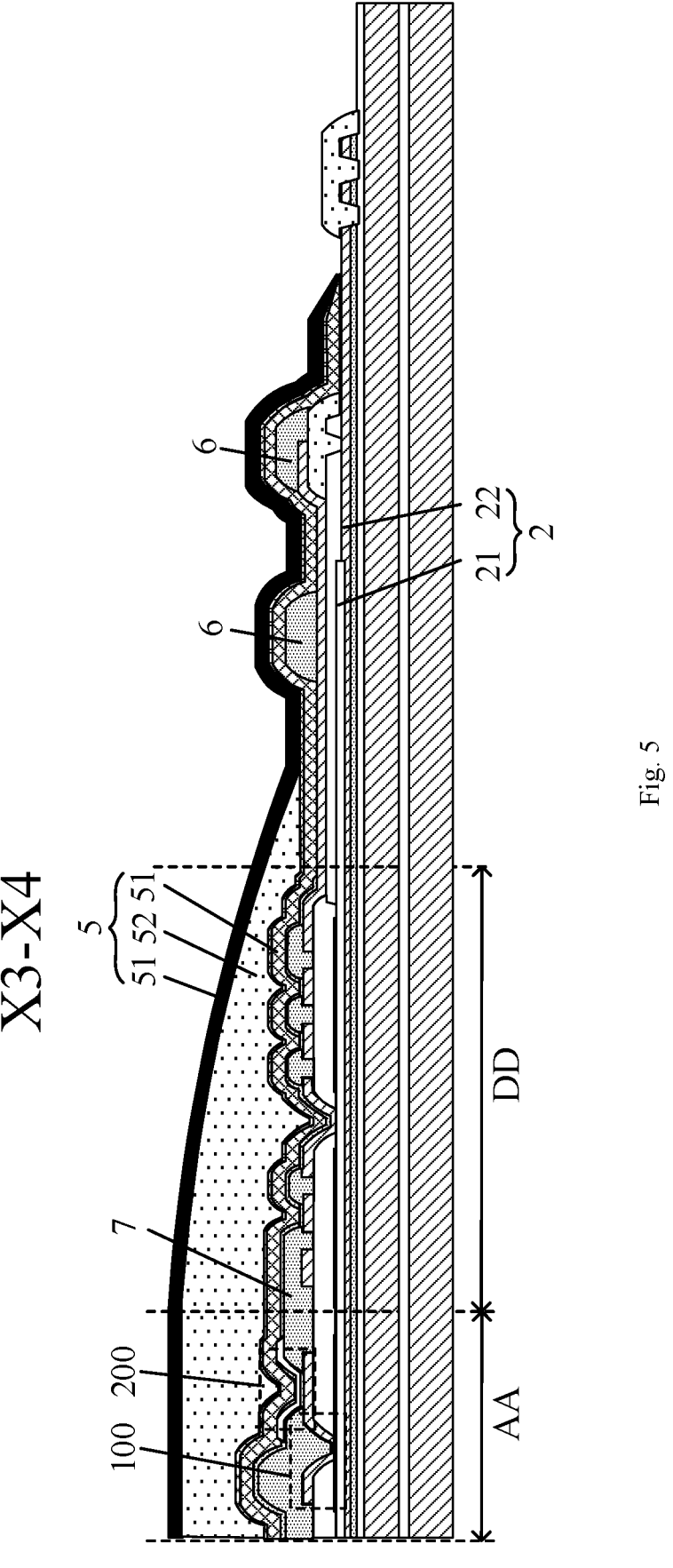
FIG. 5 is a schematic structural diagram of a partial cross-section of a display substrate in a direction of X3-X4 in FIG. 1 provided by another embodiment of the present application.

Please refer to FIG. 1 to FIG. 5. FIG. 1 is a schematic structural diagram of a plane of a display substrate. FIG. 2 and FIG. 3 are sectional views of a display substrate under a condition of a specific embodiment. FIG. 4 and FIG. 5 are sectional views of a display substrate under a condition of another embodiment. Specifically, FIG. 2 and FIG. 4 are schematic sectional views of a display substrate in a direction of X1-X2 in FIG. 1, and FIG. 3 and FIG. 5 are schematic sectional views of a display substrate in a direction of X3-X4 in FIG. 1. It needs to be noted that for describing approximate positions and forms of structures in the display substrate as clearly as possible, conditions of specific structures shown in the schematic sectional views of FIG. 2 and FIG. 4 are not completely consistent with conditions of specific structures shown in the schematic sectional views of FIG. 3 and FIG. 5. For example, the sectional views in FIG. 2 and FIG. 4 illustrate a TFT 3 and a memory capacitor 4 in a pixel circuit in a display area AA, but in FIG. 3 and FIG. 5, in the display area AA, merely a position of the pixel circuit 100 is illustrated approximately, and a light-emitting structure 200 driven by the pixel circuit 100 is mainly illustrated. Besides, a combined structure of an inorganic layer 51 and an organic layer 52 in an encapsulation layer 5 and a structure of a blocking dam 6 are illustrated in FIG. 3 and FIG. 5 but are not illustrated in FIG. 2 and FIG. 4. Though the schematic sectional views of FIG. 2 and FIG. 4 and the schematic sectional views of FIG. 3 and FIG. 5 embody conditions of parts of specific structures emphatically and respectively, those skilled in the art can know a condition of a whole structure of a section completely according to common knowledge, which is not repeated here.

Specifically, as shown in FIG. 1 to FIG. 5, an embodiment of the present application provides a display substrate, including a base substrate 1, a gate layer, an interlayer insulation layer 2, a source and drain layer and an encapsulation layer 5. The base substrate 1 is provided with a display area AA and a non-display area surrounding the display area AA. The gate layer (for example, a gate metal layer) is on the base substrate 1. The interlayer insulation layer 2 is on a side of the gate layer away from the base substrate 1 and includes a first organic insulation layer 21 and a first inorganic insulation layer 22, wherein the first organic insulation layer 21 covers the display area AA and part of the non-display area. The source and drain layer (for example, a source and drain metal layer) is on a side of the interlayer insulation layer 2 away from the base substrate 1;

The encapsulation layer 5 covers the display area AA and part of the non-display area, wherein an orthographic projection of a boundary of the encapsulation layer 5 on the base substrate 1 surrounds an orthographic projection of the first organic insulation layer 21 on the base substrate 1.

Exemplarily, the display substrate includes a pixel circuit in the display area AA and a metal routing wire in the non-display area. As shown in FIG. 2 and FIG. 4, the pixel circuit 100 includes a thin film transistor(s) (TFT) 3 and a memory capacitor 4 and other device structures. Specifically, the gate layer (for example, the gate metal layer) may include a gate 31 of the TFT 3, a bottom electrode 41 and a top electrode 42 of the memory capacitor 4, and a gate layer metal routing wire 91 in the non-display area, and other structures. The source and drain layer (for example, the source and drain metal layer) may include a source electrode 32 and a drain electrode 33 of the TFT 3, a connection lead 43 of the bottom electrode 41 of the memory capacitor 4, a source and drain layer metal routing wire 92 and a connecting terminal 93 in the non-display area and other structures.

In the above display substrate, the interlayer insulation layer 2 is between the gate metal layer and the source and drain metal layer. The interlayer insulation layer 2 is provided with a combined structure of the first organic insulation layer 21 and the first inorganic insulation layer 22. The first organic insulation layer 21 covers the display area AA and part of the non-display area, and stress can be effectively buffered, so that the gate metal layer and the source and drain metal layer on an upper side and lower side of the interlayer insulation layer are protected. Compared with a conventional inorganic interlayer insulation layer, bending resistance of the display substrate can be effectively improved. Besides, the orthographic projection of the boundary of the encapsulation layer 5 surrounds the orthographic projection of the first organic insulation layer 21, namely, the first organic insulation layer 21 is located in the encapsulation layer 5, a boundary of the first organic insulation layer 21 does not exceed the boundary of the encapsulation layer 5, so water vapor can be effectively prevented from invading through the first organic insulation layer 21, and the yield of encapsulation is guaranteed. Besides, a good insulation protection can be achieved by setting the first inorganic insulation layer 22, the situation of breakdown and burning of metal routing wires is prevented, and then the yield of a driving circuit of the display substrate is guaranteed.

To sum up, according to the display substrate disclosed by the embodiment of the present application, by improving a structure of the interlayer insulation layer of the thin film transistor in the flexible display panel, bending resistance of the flexible display substrate can be improved, the situations of poor encapsulation, breakdown and burning of routing wires and the like are avoided, then the yield of a flexible display product is improved, and the display substrate is particularly suitable for a folded or abnormal type AMO-LED display needing large bendability.

As shown in FIG. 1 to FIG. 5, in some embodiments, the non-display area includes a fan routing wire area (fanout area) CC and a bonding area BB which are on a first side of the display area A, and a gate driving circuit area (GOA area) DD on at least one side of two opposite sides of the display area AA, wherein the two opposite sides are adjacent to the first side.

Specifically, as shown in FIG. 3 and FIG. 5, the first organic insulation layer 21 covers the gate driving circuit area DD. As shown in FIG. 2 and FIG. 4, the orthographic projection of the first organic insulation layer 21 on the base substrate 1 does not overlap with the bonding area BB.

Specifically, in a bending process of the display substrate, a bending line usually passes through the display area AA and the gate driving circuit area DD on the two opposite sides of the display area AA, and the first organic insulation layer 21 covers the gate driving circuit area DD, so that the bending resistance of the gate driving circuit area DD can be effectively improved, whole bending performance of the display substrate is improved, and the display substrate can meet a demand for large-angle bendability. Besides, the bonding area BB is beyond the boundary of the encapsulation layer 5, the encapsulation layer 5 does not cover the bonding area, the orthographic projection of the first organic insulation layer 21 does not overlap with the bonding area BB, so water vapor can be prevented from invading the substrate along the first organic insulation layer 21, and the yield of encapsulation is guaranteed.

As shown in FIG. 2 to FIG. 5, in some embodiments, the first inorganic insulation layer 22 at least covers part of the non-display area, an orthographic projection of the first inorganic insulation layer 22 on the non-display area overlaps with an orthographic projection of the first organic insulation layer 21 on the non-display area.

Exemplarily, the first inorganic insulation layer 22 covers the fanout area CC and the bonding area BB.

Specifically, there are few insulation film layers in the non-display area, and metal routing wires are densely distributed, for example, the fanout area CC and the bonding area BB, so the situation of breakdown and burning of the routing wires is prone to occurring. The first inorganic insulation layer 22 covers the non-display area, the situation of burning the routing wires in the display substrate can be effectively prevented , and then the yield of a driving circuit of the display substrate is guaranteed. Besides, the orthographic projection of the first inorganic insulation layer 22 on the non-display area overlaps with the orthographic projection of the first organic insulation layer 21 on the non-display area, the water vapor can be prevented from entering the substrate along the first organic insulation layer 21, and then encapsulation and water-proof performance of the display substrate is effectively improved.

As shown in FIG. 1, FIG. 2 and FIG. 3, in some embodiments, the orthographic projection of the first inorganic insulation layer 22 on the base substrate 1 is in the non-display area and surrounds the display area AA, the first inorganic insulation layer 22 is located on a side of the first organic insulation layer 21 away from the gate layer, and the first inorganic insulation layer 22 covers the boundary of the first organic insulation layer 21.

Specifically, the first inorganic insulation layer 22 is located on the side of the first organic insulation layer 21 away from the gate layer, that is, the gate layer, the first organic insulation layer 21, the first inorganic insulation layer 22 and the source and drain layer are on the base substrate 1 in sequence. At the moment, in the interlayer insulation layer 2, the first inorganic insulation layer 22 is above the first organic insulation layer 21, and compared with the first organic insulation layer 21, influence of the first inorganic insulation layer 22 on bending performance of the gate layer is larger. In the embodiment, the first inorganic insulation layer 22 is arranged merely in the non-display area, that is, the display area AA is not covered with the first inorganic insulation layer 22, the bending performance of the whole display area AA can be improved, and thus the bending performance of the whole display substrate is effectively improved.

Besides, the first inorganic insulation layer 22 is above the first organic insulation layer 21 and covers the boundary of the first organic insulation layer 21, so the water vapor can be effectively prevented from entering a panel through the first organic insulation layer 21, and then the encapsulation and water-proof performance of the display substrate is effectively improved.

Exemplarily, as shown in FIG. 3, the orthographic projection of the first inorganic insulation layer 22 on the base substrate 1 does not overlap with the gate driving circuit area DD, that is, the first inorganic insulation layer 22 does not cover the gate driving circuit area (GOA area) DD on the two opposite sides of the display area AA. In this way, the bending performance of the non-display area on two sides of the display area AA can be further improved, so that the bending performance of the whole display substrate is further improved.

As shown in FIG. 1, FIG. 4 and FIG. 5, in some other embodiments, the first inorganic insulation layer 22 is between the gate layer and the first organic insulation layer 21, and the first inorganic insulation layer 22 covers the display area AA and the non-display area.

Specifically, the first inorganic insulation layer 22 is between the gate layer and the first organic insulation layer 21, that is, the gate layer, the first inorganic insulation layer 22, the first organic insulation layer 21 and the source and drain layer are on the base substrate 1 in sequence. At the moment, in the interlayer insulation layer 2, the first organic insulation layer 21 is above the first inorganic insulation layer 22, and compared with the first inorganic insulation layer 22, influence of the first organic insulation layer 21 on the bending performance of the gate layer is larger. The first organic insulation layer 21 can effectively protect the gate layer below it so as to prevent the gate layer from being bent and damaged, and thus the bending performance of the display substrate is effectively improved. Accordingly, in the embodiment, the first inorganic insulation layer 22 may be arranged to cover not only the display area AA, but also the non-display area, on the one hand, steps of a patterning process of the first inorganic insulation layer 22 can be reduced, on the other hand, an insulation effect between metal layers of the display area AA can also be improved.

Exemplarily, as shown in FIG. 4, the part of the first inorganic insulation layer 22 covering the display area AA may be provided with a hollow-out part 220, and the hollow-out part 220 does not overlap with a pattern of the gate layer. In other words, an area, without the pattern of the gate layer, of the first inorganic insulation layer 22 in the display area A may be hollowed out.

For example, the pixel circuit includes the thin film transistor 3 (TFT) and the memory capacitor 4 and other device structures with a gate metal pattern, the first inorganic insulation layer 22 covers a pattern of the gate layer in the thin film transistor 3 and the memory capacitor 4, and the first inorganic insulation layer 22 is provided with the hollow-out part 220 between the thin film transistor 3 and the memory capacitor 4, that is, the first inorganic insulation layer 22 does not cover the part, without the pattern of the gate layer, between the thin film transistor 3 and the memory capacitor 4.

Specifically, the area, without the pattern of the gate layer, of the first inorganic insulation layer 22 is provided with the hollow-out part 220, so that an insulation effect of the first inorganic insulation layer 22 between the gate metal layer and the source and drain metal layer can be guaranteed, stress nearby the first inorganic insulation layer 22 can be released when the display substrate is bent. Therefore, a stress buffer effect of the display area is improved, and the bending performance of the display substrate is improved. Furthermore, the first organic insulation layer 21 can cover the first inorganic insulation layer 22 and its hollow-out part at the same time, thus adhesion between the first organic insulation layer 21 and the base substrate 1 is improved, and then problems of peeling of the first organic insulation layer 21 and the like are avoided.

Certainly, specific arrangement of the first inorganic insulation layer 22 is not limited to description in the embodiment of the present application, for example, when the first organic insulation layer 21 is above the first inorganic insulation layer 22, the first inorganic insulation layer 22 may also be to cover merely the non-display area so as not to affect the bending performance of the display area AA; or when the first inorganic insulation layer 22 is above the first organic insulation layer 21, the first inorganic insulation layer 22 may also cover the display area AA, and by arranging the hollow-out part in the first inorganic insulation layer 22, the bending performance of the display area AA is not affected. Specific effects of the above arrangement may specifically refer to the aforementioned embodiment and are not repeated here.

As shown in FIG. 1, FIG. 3 and FIG. 5, in some embodiments, the display substrate of the present application further includes at least one layer of blocking dam 6 in the non-display area and sequentially arranged in a direction of the display area AA to the non-display area.

Specifically, the blocking dam 6 may be fabricated on the same layer as a pixel defining layer 7, or patterns of other film layers may be also included. The encapsulation layer 5 usually includes two layers of inorganic layers 51 and a layer of organic layer 52, the blocking dam 6 is mainly used for preventing the organic layer 52 of the encapsulation layer 5 from exceeding an encapsulation area, and preventing the water vapor from entering the encapsulation area.

Exemplarily, an orthographic projection of the boundary of the first organic insulation layer 21 on the base substrate 1 is on a side of the last layer of blocking dam 6 facing the display area AA, that is, the boundary of the first organic insulation layer 21 does not exceed the blocking dam 6 and does not extend beyond the encapsulation area, so that the water vapor can be prevented from entering the substrate through the first organic insulation layer 21.

In some embodiments, in the interlayer insulation layer 2, a thickness of the first organic insulation layer 21 is much larger than a thickness of the first inorganic insulation layer 22. Exemplarily, the thickness of the first organic insulation layer 21 may be about in a range of 1 μm to 2 μm, and the thickness of the first inorganic insulation layer 22 may be about in a range of 50 nm to 150 nm. "About" here means that a boundary of a numerical value is not strictly limited and allows a numerical value within a range of a process error and a measurement error.

Exemplarily, in the display substrate of the embodiment of the present application, the pixel circuit includes the thin film transistor (TFT) 3 and the memory capacitor 4, the thin film transistor 3 may include an active layer 34, a gate 31, a source electrode 32 and a drain electrode 33, and the memory capacitor 4 includes a bottom electrode 41 and a top electrode 42. The display substrate further includes a first gate insulation layer 81, a second gate insulation layer 82, a passivation layer (not shown in the figure), a planarization layer 83, the pixel defining structure 7, the encapsulation layer 5 and the like. Structures of these layer may be arranged conventionally, which is not repeated here.

An embodiment of the present application further provides a display panel, and the display panel includes any display substrate described above.

Specifically, the display panel may be a flexible LTPS AMOLED display panel, and the display substrate is a flexible backboard.

An embodiment of the present application further provides a display apparatus which includes the above display panel.

Specifically, the above display apparatus may be applied to various electronic devices such as a TV, a display, a tablet computer and a smartphone.

Figure 6:
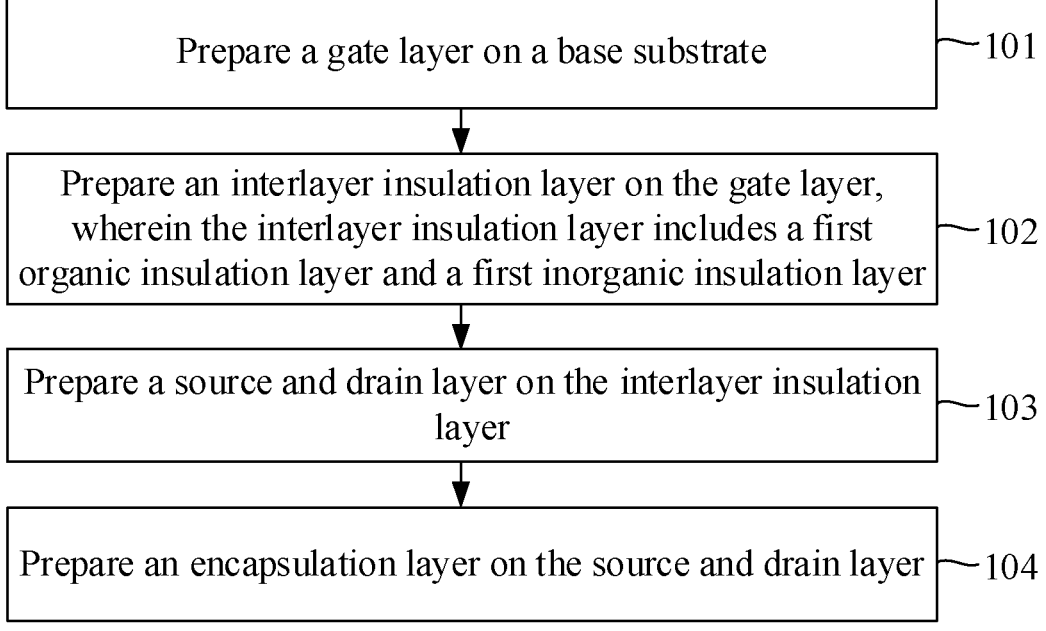
FIG. 6 is a flowchart of a preparation method for a display substrate provided by an embodiment of the present application.

Besides, based on the display substrate provided by the embodiment of the present application, an embodiment of the present application further provides a preparation method for the display substrate, as shown in FIG. 6, including the following steps.

Step 101, a gate layer (for example, a gate metal layer) is prepared on a base substrate, wherein the base substrate is provided with a display area and a non-display area surrounding the display area.

Step 102, an interlayer insulation layer is prepared on the gate layer, wherein the interlayer insulation layer includes a first organic insulation layer and a first inorganic insulation layer, and the first organic insulation layer covers the display area and part of the non-display area.

Step 103, a source and drain layer (for example, a source and drain metal layer) is prepared on the interlayer insulation layer.

Step 104, an encapsulation layer is prepared on the source and drain layer, wherein the encapsulation layer covers the display area and part of the non-display area, and an orthographic projection of a boundary of the encapsulation layer on the base substrate surrounds an orthographic projection of the first organic insulation layer on the base substrate.

In some embodiments, before step 101, the method may include the following steps. As shown in (1) in FIG. 7, an active layer 34 is prepared on the base substrate 1, and a first gate insulation layer 81 is deposited on the active layer 34.

Specifically, step 101, preparing the gate layer on the base substrate may specifically include the following steps. As shown in (1) in FIG. 7, a first metal layer is deposited on the base substrate 1, and a pattern of the first gate metal layer is formed through a patterning process, wherein the pattern of the first gate metal layer includes a gate 31 of a TFT 3, a bottom electrode 41 of a memory capacitor 4, a gate layer routing wire and other structures; a second gate insulation layer 82 is deposited on the first metal layer; and a second metal layer is deposited on the second gate insulation layer 82, and a pattern of a second gate metal layer is formed through the patterning process, wherein the pattern of the second gate metal layer includes a top electrode 42 of the memory capacitor.

In some embodiments, step 102, preparing the interlayer insulation layer on the gate layer may specifically include the following steps. As shown in (1) to (2) in FIG. 7, the first organic insulation layer 21 is deposited on the gate layer, and a pattern of the first organic insulation layer 21 is formed through the patterning process, wherein the pattern of the first organic insulation layer 21 covers the display area and part of the non-display area, and a first via hole 211 is formed in the pattern of the first organic insulation layer 21. Exemplarily, the first via hole may include a via hole used for connecting a source and drain electrode with a heavily doped area of an active layer of the TFT and a via hole used for connecting a connection lead of the bottom electrode of the memory capacitor with the bottom electrode.

Figure 7:
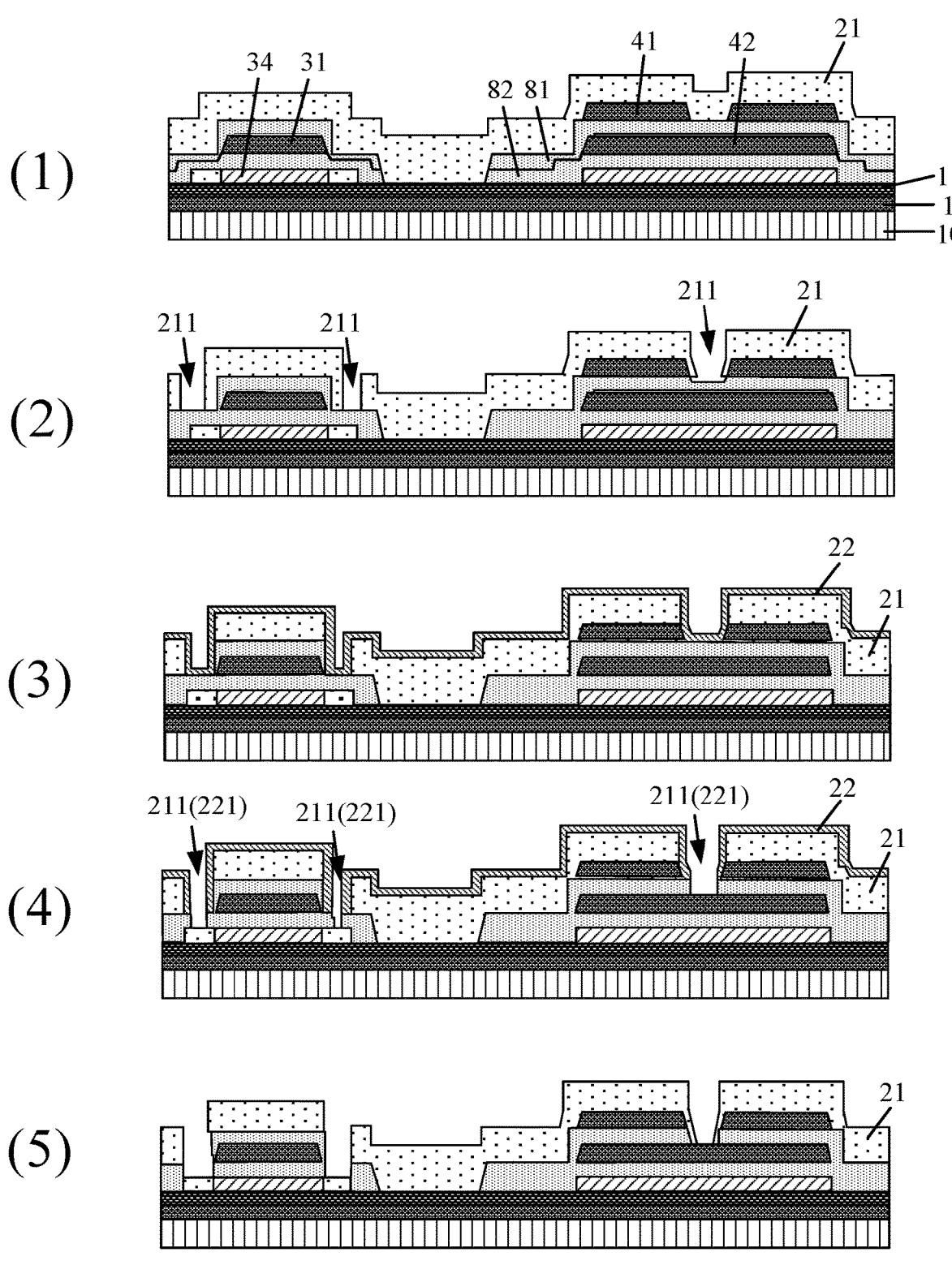
FIG. 7 is a schematic structural diagram of a partial cross-section of a display substrate in a fabrication process provided by an embodiment of the present application.

As shown in (3) to (5) in FIG. 7, the first inorganic insulation layer 22 is deposited on the first organic insulation layer 21, and a pattern of the first inorganic insulation layer 22 is formed through the patterning process. Specifically, an orthographic projection of the pattern of the first inorganic insulation layer 22 on the base substrate 1 is in the non-display area and surrounds the display area, so the display area shown in (5) in FIG. 7 is not covered with the first inorganic insulation layer, and merely the first organic insulation layer 21 is left.

Exemplarily, a process of forming the pattern of the first inorganic insulation layer through the patterning process may specifically include the following.

As shown in (4) in FIG. 7, a second via hole 221 which penetrates through the first inorganic insulation layer and gate insulation layers (including the first gate insulation layer and the second gate insulation layer) is formed through etching by first-time patterning, the second via hole 221 is located in the first via hole 211, the heavily doped area of the active layer of the TFT and the bottom electrode of the memory capacitor are exposed, and the first inorganic insulation layer of the display area is completely etched out through second-time patterning, so the orthographic projection of the first inorganic insulation layer is in the non-display area and surrounds the display area. As shown in (5) in FIG. 7, at the moment, the display area is not covered with the first inorganic insulation layer, and merely the first organic insulation layer 21 is left.

In some other embodiments, step 102, the interlayer insulation layer is prepared on the gate layer, which may specifically include the following.

Figure 8:
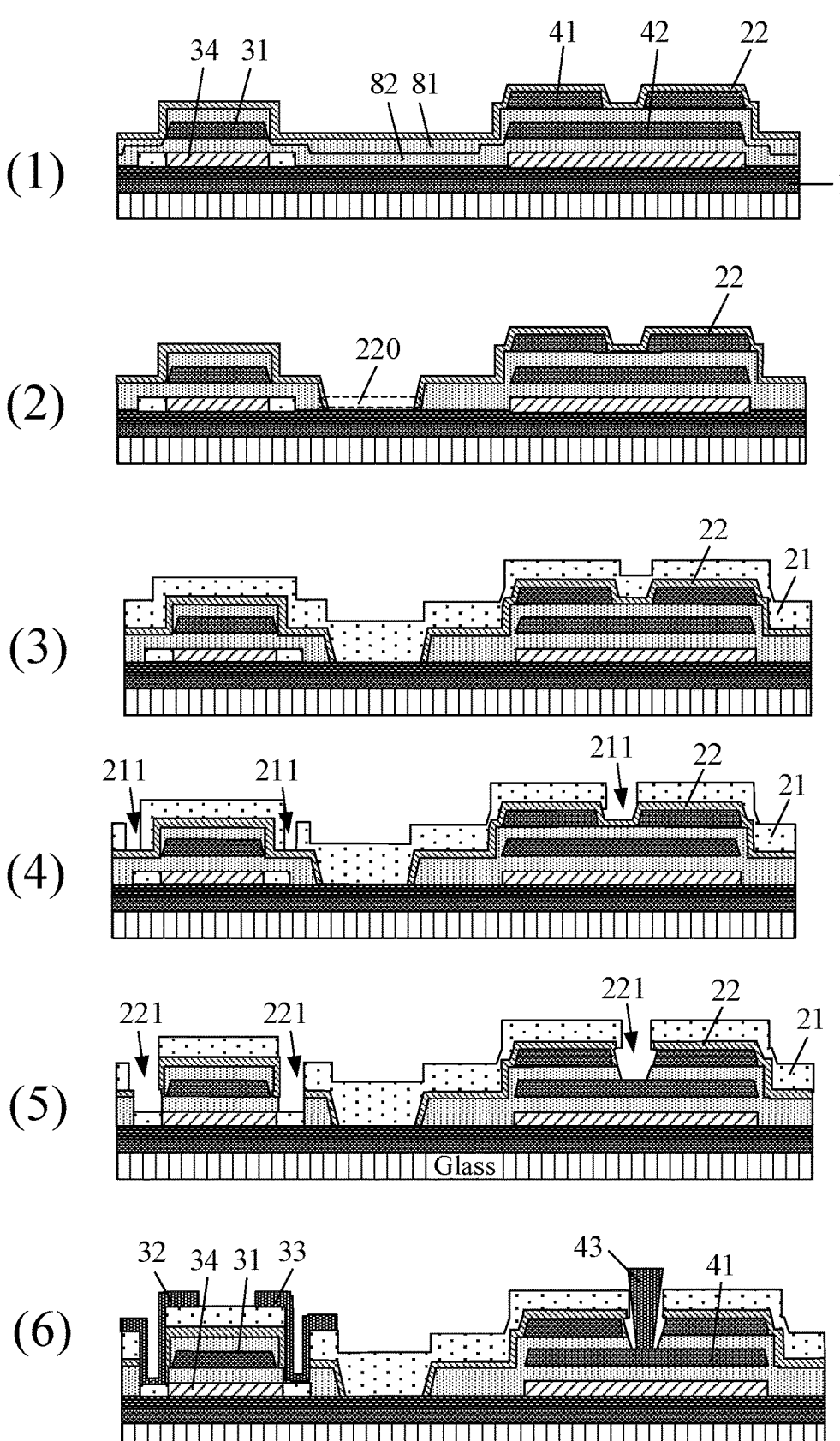
FIG. 8 is a schematic structural diagram of a partial cross-section of a display substrate in a fabrication process provided by another embodiment of the present application.

As shown in (1) to (2) in FIG. 8, the first inorganic insulation layer 22 is deposited on the gate layer, and a pattern of the first inorganic insulation layer 22 is formed through the patterning process.

As shown in (3) to (6) in FIG. 8, the first organic insulation layer 21 is deposited on the first inorganic insulation layer 22, and a pattern of the first organic insulation layer 21 is formed through the patterning process.

Exemplarily, forming the pattern of the first inorganic insulation layer through the patterning process may specifically include the following.

As shown in (2) in FIG. 8, the part of the first inorganic insulation layer 22 covering the display area is etched to form a hollow-out part 220 through the patterning process, specifically, the hollow-out part 220 may be between a thin film transistor and the memory capacitor.

Exemplarily, forming the pattern of the first organic insulation layer through the patterning process may specifically include the following.

As shown in (4) in FIG. 8, the first via hole 211 which penetrates through the first organic insulation layer 21 is formed through etching by first-time patterning. As shown in (5) in FIG. 8, the first inorganic insulation layer 22 and the gate insulation layers (including the first gate insulation layer and the second gate insulation layer) below the first via hole are further etched through second-time patterning, so that the above first via hole further penetrates through the first inorganic insulation layer and the gate insulation layers so as to form the second via hole 221, and thus the heavily doped area of the active layer of the TFT and the bottom electrode of the memory capacitor are exposed.

In some embodiments, step 103, the source and drain layer is prepared on the interlayer insulation layer, which may specifically include the following.

As shown in (6) in FIG. 8, a third metal layer is deposited on the interlayer insulation layer, and a pattern of a source and drain electrode metal layer is formed through the patterning process. The pattern of the source and drain electrode metal layer includes a source electrode 32 and a drain electrode 33 of the TFT and a connection lead 43 of the bottom electrode 41 of the memory capacitor. The source electrode 32 and the drain electrode 33 of the TFT are connected with the heavily doped area of the active layer 34 of the TFT through the second via hole, and the connection lead 43 of the bottom electrode 41 of the memory capacitor is connected with the bottom electrode 41 of the memory capacitor through the second via hole.

Exemplarily, the display substrate provided by the embodiment of the present application is a flexible substrate, and the base substrate is a flexible substrate (PI). The preparation method for the display substrate provided by the embodiment of the present application may further include steps that as shown in (1) in FIG. 7, a flexible base substrate 1 is prepared on a rigid substrate (glass substrate) 10, a buffer layer 11 is prepared on the flexible base substrate 1, and the like, and may further include a step that the rigid substrate 10 is peeled. All these steps can adopt a conventional technology and are not repeated here.

It needs to be noted that in some embodiments of the present disclosure, the preparation method for the display substrate may further include more steps, which can be determined according to actual demands and is not limited by the embodiments of the present disclosure, and detailed description and technical effects may refer to description of the display substrate above and are not repeated here. Besides, in the preparation method for the display substrate provided by the embodiment of the present disclosure, specific technical methods and preparation processes of steps 101, 102 and 103 are not limited to the embodiments given above, and may also adopt other technical modes and steps for preparation, which may specifically refer to description of structures of all layers in the display substrate above and is not repeated here.

Apparently, those skilled in the art can make various changes and transformations to the embodiments of the present application without departing from the spirit and scope of the present application. In this case, if these changes and transformations of the present application belong to the scope of claims and their equivalents of the present application, the present application also intends to include these changes and transformations.

What is claimed is:

1. A display substrate, comprising:
a base substrate, provided with a display area and a non-display area surrounding the display area;
a gate layer on the base substrate;
an interlayer insulation layer on a side of the gate layer away from the base substrate, comprising a first organic insulation layer and a first inorganic insulation layer, wherein the first organic insulation layer covers the display area and at least part of the non-display area, and a part of the first inorganic insulation layer covering the display area is provided with a hollow-out part, and the hollow-out part does not overlap with a pattern of the gate layer;
a source and drain layer on a side of the interlayer insulation layer away from the base substrate; and
an encapsulation layer, covering the display area and part of the non-display area, wherein an orthographic projection of a boundary of at least part of the encapsulation layer on the base substrate surrounds an orthographic projection of the first organic insulation layer on the base substrate.

2. The display substrate according to claim 1, wherein the non-display area comprises a fan routing wire area and a bonding area on a first side of the display area, and a gate driving circuit area on at least one side of two opposite sides of the display area, and the two opposite sides are adjacent to the first side; and
the first organic insulation layer covers the gate driving circuit area, and the orthographic projection of the first organic insulation layer on the base substrate does not overlap with the bonding area.

3. The display substrate according to claim 1, wherein the first inorganic insulation layer at least covers part of the non-display area, and an orthographic projection of the first inorganic insulation layer on the non-display area overlaps with an orthographic projection of the first organic insulation layer on the non-display area.

4. The display substrate according to claim 2, wherein the first inorganic insulation layer covers the fan routing wire area and the bonding area.

5. The display substrate according to claim 1, wherein the first inorganic insulation layer is between the gate layer and the first organic insulation layer, and the first inorganic insulation layer covers the display area and the non-display area.

6. The display substrate according to claim 1, wherein
an orthographic projection of the first inorganic insulation layer on the base substrate is in the non-display area and surrounds the display area, the first inorganic insulation layer is on a side of the first organic insulation layer away from the gate layer, and the first inorganic insulation layer covers a boundary of the first organic insulation layer.

7. The display substrate according to claim 2, wherein
the orthographic projection of the first inorganic insulation layer on the base substrate does not overlap with the gate driving circuit area.

8. The display substrate according to claim 1, further comprising at least one layer of blocking dam in the non-display area and sequentially arranged in a direction from the display area to the non-display area;
wherein an orthographic projection of the boundary of the first organic insulation layer on the base substrate is on a side of a last layer of blocking dam facing the display area.

9. The display substrate according to claim 1, wherein a thickness of the first organic insulation layer is in a range of 1 μm to 2 μm, and a thickness of the first inorganic insulation layer is in a range of 50 nm to 150 nm.

10. A display panel, comprising the display substrate according to claim 1.

11. A preparation method for a display substrate, comprising:
preparing a gate layer on a base substrate, wherein the base substrate is provided with a display area and a non-display area surrounding the display area;
preparing an interlayer insulation layer on the gate layer, wherein the interlayer insulation layer comprises a first organic insulation layer and a first inorganic insulation layer, the first organic insulation layer covers the display area and part of the non-display area, and a part of the first inorganic insulation layer covering the display area is provided with a hollow-out part, and the hollow-out part does not overlap with a pattern of the gate layer;

preparing a source and drain layer on the interlayer insulation layer; and preparing an encapsulation layer on the source and drain layer, wherein the encapsulation layer covers the display area and part of the non-display area, and an orthographic projection of a boundary of the encapsulation layer on the base substrate surrounds an orthographic projection of the first organic insulation layer on the base substrate.

12. The preparation method according to claim 11, wherein the preparing the interlayer insulation layer on the gate layer specifically comprises:

depositing the first organic insulation layer on the gate layer, and forming a pattern of the first organic insulation layer through a patterning process; and depositing the first inorganic insulation layer on the first organic insulation layer, and forming a pattern of the first inorganic insulation layer through the patterning process, wherein an orthographic projection of the pattern of the first inorganic insulation layer on the base substrate is in the non-display area and surrounds the display area, and the pattern of the first inorganic insulation layer covers a boundary of the first organic insulation layer.

13. The preparation method according to claim 11, wherein the preparing the interlayer insulation layer on the gate layer specifically comprises:

depositing the first inorganic insulation layer on the gate layer, and forming a pattern of the first inorganic insulation layer through a patterning process; and depositing the first organic insulation layer on the first inorganic insulation layer, and forming a pattern of the first organic insulation layer through the patterning process.

14. The display substrate according to claim 2, further comprising at least one layer of blocking dam in the non-display area and sequentially arranged in a direction from the display area to the non-display area;

wherein an orthographic projection of the boundary of the first organic insulation layer on the base substrate is on a side of a last layer of blocking dam facing the display area.

15. The display substrate according to claim 3, further comprising at least one layer of blocking dam in the non-display area and sequentially arranged in a direction from the display area to the non-display area;

wherein an orthographic projection of the boundary of the first organic insulation layer on the base substrate is on a side of a last layer of blocking dam facing the display area.

16. The display substrate according to claim 4, further comprising at least one layer of blocking dam in the non-display area and sequentially arranged in a direction from the display area to the non-display area;

wherein an orthographic projection of the boundary of the first organic insulation layer on the base substrate is on a side of a last layer of blocking dam facing the display area.

17. The display substrate according to claim 2, wherein a thickness of the first organic insulation layer is in a range of 1 μm to 2 μm, and a thickness of the first inorganic insulation layer is in a range of 50 nm to 150 nm.

18. The display substrate according to claim 3, wherein a thickness of the first organic insulation layer is in a range of 1 μm to 2 μm, and a thickness of the first inorganic insulation layer is in a range of 50 nm to 150 nm.

19. The display substrate according to claim 4, wherein a thickness of the first organic insulation layer is in a range of 1 μm to 2 μm, and a thickness of the first inorganic insulation layer is in a range of 50 nm to 150 nm.

* * * * *